(12) United States Patent
Ouyang et al.

(10) Patent No.: US 10,607,668 B2
(45) Date of Patent: Mar. 31, 2020

(54) DATA PROCESSING METHOD AND APPARATUS

(71) Applicant: BEIJING BAIDU NETCOM SCIENCE AND TECHNOLOGY CO., LTD., Haidian District Beijing (CN)

(72) Inventors: Jian Ouyang, Beijing (CN); Wei Qi, Beijing (CN); Yong Wang, Beijing (CN)

(73) Assignee: Beijing Baidu Netcom Science and Technology Co., Ltd., Beijing (CN)

( * ) Notice: Subject to any disclaimer, the term of this patent is extended or adjusted under 35 U.S.C. 154(b) by 98 days.

(21) Appl. No.: 15/281,283

(22) Filed: Sep. 30, 2016

(65) Prior Publication Data

US 2017/0365306 A1 Dec. 21, 2017

(30) Foreign Application Priority Data

Jun. 21, 2016 (CN) .......................... 2016 1 0454483

(51) Int. Cl.
*G11C 7/10* (2006.01)
*G06N 3/04* (2006.01)
(Continued)

(52) U.S. Cl.
CPC ........ *G11C 7/1072* (2013.01); *G06F 9/30025* (2013.01); *G06N 3/0481* (2013.01);
(Continued)

(58) Field of Classification Search
CPC ........ G06N 3/02; G06N 3/0481; G06F 17/18; G06F 12/00
See application file for complete search history.

(56) References Cited

U.S. PATENT DOCUMENTS 5,796,925 A * 8/1998 Deville ................ G06N 3/0481
706/25
6,041,322 A * 3/2000 Meng ................... G06N 3/0481
706/25

(Continued)

OTHER PUBLICATIONS

J. Yan, et. al., An FPGA-Based Accelerator for LambdaRank in Web Search Engines, ACM Transactions on Reconfigurable Technology and Systems, vol. 4, No. 3, Article 25, 2011, p. 25:1-25:19. (Year: 2011).*

(Continued)

*Primary Examiner* — Andrew Caldwell
*Assistant Examiner* — Emily E Larocque
(74) *Attorney, Agent, or Firm* — Miller, Matthias & Hull LLP

(57) ABSTRACT

The present application discloses a data processing method and apparatus. A specific embodiment of the method includes: preprocessing received to-be-processed input data; obtaining a storage address of configuration parameters of the to-be-processed input data based on a result of the preprocessing and a result obtained by linearly fitting an activation function, the configuration parameters being preset according to curve characteristics of the activation function; acquiring the configuration parameters of the to-be-processed input data according to the storage address; and processing the result of the preprocessing of the to-be-processed input data based on the configuration parameters of the to-be-processed input data and a preset circuit structure, to obtain a processing result. This implementation manner implements the processing of the input data to be processed by using the configuration parameter and the preset circuit structure, without the need to use any special circuit for implementing the activation function, thereby simplifying the circuit structure. In addition, this implementation manner can support multiple types of activation functions, thereby improving the flexibility. With such an (Continued)

embodiment, the processing of the input data to be processed can be realized by using the configuration parameters and the preset circuit structure, without the need of using a special circuit to implement the activation function, thereby simplifying the circuit structure, supporting various activation functions, and improving the flexibility.

12 Claims, 6 Drawing Sheets

(51) Int. Cl.
  *G06F 9/30* (2018.01)
  *G11C 11/41* (2006.01)
  *G11C 29/50* (2006.01)

(52) U.S. Cl.
  CPC ............ *G11C 7/1036* (2013.01); *G11C 11/41* (2013.01); *G11C 29/50004* (2013.01); *G11C 7/1006* (2013.01); *G11C 2029/5004* (2013.01)

(56) References Cited

OTHER PUBLICATIONS

Q. Yu, et.al., A Deep Learning prediction process accelerator based FPGA, 15th IEEE/ACM International Symposium on Cluster, Cloud and Grid Computing, IEEE Computer Society, May 4-7, 2015, p. 1159-1162. (Year: 2015).*

H.J. Ko, et. al., A New Non-uniform Segmentation and Addressing Remapping Strategy for Hardware-Oriented Function Evaluators Based on Polynomial Approximation, Proceedings of 2010 IEEE International Symposium on Circuits and Systems, IEEE, 2010, p. 4153-4156. (Year: 2010).*

J. Ouyang, et.al., SDA: Software Defined Accelerator for Large Scale DNN Systems, Baidu slide presentation, 2014. (Year: 2014).*

C. Alippi, et.al., Simple Approximation of Sigmoidal Functions: Realistic Design of Digital Neural Networks Capable of Learning, IEEE International Symposium on Circuits and Systems, 1991, p. 1505-1508 (Year: 1991).*

D. Chen, et.al., A dynamic non-uniform segmentation method for first-order polynomial function evaluation, MIcropocessors and Microsystems, 2012, p. 324-332. (Year: 2012).*

* cited by examiner

DATA PROCESSING METHOD AND APPARATUS

CROSS-REFERENCE TO RELATED APPLICATION

This application is related to and claims priority from Chinese Application No. 201610454483.1, filed on Jun. 21, 2016, entitled "DATA PROCESSING METHOD AND APPARATUS," the entire disclosure of which is hereby incorporated by reference.

TECHNICAL FIELD

The present application relates to the field of communication technology, particularly to the field of data processing, and more particularly to a data processing method and apparatus.

BACKGROUND

The deep learning algorithm is the core of artificial intelligence, and has a great driving effect on the development in various fields (for example, voice recognition, image recognition, and natural language processing). The deep learning algorithm is a typical calculation-intensive algorithm, and generally has a computing complexity of $O(N^3)$ (cubic order), which is usually one or two orders of magnitude higher than that of a conventional machine learning algorithm. On the other hand, the deep learning algorithm is often closely associated with large data. Generally, terabyte to petabyte order of training data and hundreds of millions to hundreds of billions of training parameters are required in order to obtain a model with sufficient precision. Combining those two points in practical applications, the deep learning algorithm has very high requirements on the amount of computation that a conventional CPU (Central Processing Unit) cannot meet. To solve the computing bottleneck of the deep learning algorithm, many companies have designed special chips for the deep learning algorithm, for example, Baidu's artificial intelligence computer, and Google's TPU (Tensor Processing Unit).

As shown in FIG. 1, a network structure of an deep learning algorithm generally has N layers of networks, wherein the N layers may range from several layers to tens of layers. Each layer may be a DNN (Deep Neural Network), RNN (Recurrent Neural Networks), or CNN (Convolutional Neural Network) structure. There are activation functions between the layers. There are more than ten types of commonly used activation functions. The activation functions between the layers may be identical or different. In the prior art, various activation functions are usually calculated in the following two approaches: 1. By means of software programming using a general-purpose processor. This approach is inefficient, because the speed of such complex computation as processing activation functions by the general-purpose processor is relatively low. 2. Using a special hardware circuit. Implementing activation functions using a special circuit requires high costs. On the one hand, the activation functions are complex, and each function needs to consume considerable circuit resources. On the other hand, to support multiple types of activation functions, the total consumption of circuit resources is great. In addition, the special circuit structure is not flexible, and cannot flexibly support new activation functions.

SUMMARY

An objective of the present application is to provide an improved data processing method and apparatus, so as to solve the technical problem mentioned in the Background.

According to a first aspect, the present application provides a data processing method, comprising: preprocessing received to-be-processed input data; obtaining a storage address of configuration parameters of the to-be-processed input data based on a result of the preprocessing and a result obtained by linearly fitting an activation function, the configuration parameters being preset according to curve characteristics of the activation function; acquiring the configuration parameters of the to-be-processed input data according to the storage address; and processing the result of the preprocessing of the to-be-processed input data based on the configuration parameters of the to-be-processed input data and a preset circuit structure, to obtain a processing result.

In some embodiments, the to-be-processed input data is a floating point number; and the preprocessing received to-be-processed input data comprises: converting the to-be-processed input data into a fixed point number.

In some embodiments, the method further includes: a step of presetting the configuration parameters based on the curve characteristics of the activation function, the step comprising: obtaining a first threshold and a second threshold for input data of the activation function based on a slope change of a curve of the activation function, wherein a slope change of the curve of the activation function corresponding to input data that is less than the first threshold or greater than the second threshold is less than a preset slope change threshold; calculating configuration parameters respectively corresponding to input data that is less than the first threshold, input data that is greater than the second threshold, and input data that is between the first threshold and the second threshold; and associating and storing the input data and the configuration parameters.

In some embodiments, the calculating configuration parameters respectively corresponding to input data that is less than the first threshold, input data that is greater than the second threshold, and input data that is between the first threshold and the second threshold comprises: calculating configuration parameters corresponding to the input data that is less than the first threshold, based on output values of the activation function corresponding to at least two pieces of input data that are less than the first threshold; calculating configuration parameters corresponding to the input data that is greater than the second threshold, based on output values of the activation function corresponding to at least two pieces of input data that are greater than the second threshold; and performing non-uniform segmentation on input data between the first threshold and the second threshold, and calculating configuration parameters corresponding to input data in each segment.

In some embodiments, the performing non-uniform segmentation on input data between the first threshold and the second threshold, and calculating configuration parameters corresponding to input data in each segment comprises: dividing the input data between the first threshold and the second threshold into at least one non-uniform segment by using a successive approximation process; and calculating configuration parameters corresponding to an input variable in each non-uniform segment, based on output values of the activation function corresponding to input data of at least two points in each non-uniform segment.

In some embodiments, the dividing the input data between the first threshold and the second threshold into at least one non-uniform segment by using a successive approximation process comprises: uniformly dividing the input data between the first threshold and the second threshold into a set number of intervals, and uniformly dividing each interval into a set number of sub-intervals; connecting ½ sampled values of neighboring sub-intervals in each interval to obtain at least one straight line, and determining whether an error between each of the at least one straight line and an output value curve of the activation function at a corresponding position exceeds a preset error threshold; if not, combining every two neighboring straight lines in the obtained straight lines to obtain a combined straight line, and determining whether an error between the combined straight line and an output value curve of the activation function at a corresponding position exceeds the error threshold; and obtaining at least one straight line in each interval through repetition, wherein a value range corresponding to each straight line is a segment of the input data.

In some embodiments, the obtaining a storage address of configuration parameters of the to-be-processed input data based on a result of the preprocessing and a result obtained by linearly fitting an activation function comprises: comparing the result of the preprocessing of the to-be-processed input data with the first threshold and the second threshold; obtaining a storage address of configuration parameters corresponding to the input data that is less than the first threshold, if the result of the preprocessing of the to-be-processed input data is less than the first threshold; obtaining a storage address of configuration parameters corresponding to the input data that is greater than the second threshold, if the result of the preprocessing of the input data to be processed is greater than the second threshold; and searching in a segment range of an interval into which the result of the preprocessing of the to-be-processed input data falls, and obtaining a storage address of configuration parameters corresponding to the input data in the segment, if the result of the preprocessing of the input data to be processed falls between the first threshold and the second threshold.

According to a second aspect, the present application provides a data processing apparatus, comprising: a preprocessing unit, configured to preprocess received to-be-processed input data; a storage address obtaining unit, configured to obtain a storage address of configuration parameters of the to-be-processed input data based on a result of the preprocessing and a result obtained by linearly fitting an activation function, the configuration parameters being preset according to curve characteristics of the activation function; a configuration parameter acquiring unit, configured to acquire the configuration parameters of the to-be-processed input data according to the storage address; and a processing unit, configured to process the result of the preprocessing of the to-be-processed input data based on the configuration parameters of the to-be-processed input data and a preset circuit structure, to obtain a processing result.

In some embodiments, the to-be-processed input data is a floating point number; and the preprocessing unit is further configured to: convert the to-be-processed input data into a fixed point number.

In some embodiments, the apparatus further includes a parameter configuring unit, wherein the parameter configuring unit comprises a threshold obtaining unit, a calculation unit, and a storage unit, wherein the threshold obtaining unit is configured to obtain a first threshold and a second threshold for input data of the activation function based on a slope change of a curve of the activation function, wherein a slope change of the curve of the activation function corresponding to input data that is less than the first threshold or greater than the second threshold is less than a preset slope change threshold; the calculation unit is configured to calculate configuration parameters respectively corresponding to input data that is less than the first threshold, input data that is greater than the second threshold, and input data that is between the first threshold and the second threshold; and the storage unit is configured to associate and store the input data and the configuration parameters.

In some embodiments, the calculation unit comprises a first calculation subunit, a second calculation subunit, and a third calculation subunit, the first calculation subunit is configured to calculate configuration parameters corresponding to the input data that is less than the first threshold, based on output values of the activation function corresponding to at least two pieces of input data that are less than the first threshold; the second calculation subunit is configured to calculate configuration parameters corresponding to the input data that is greater than the second threshold, based on output values of the activation function corresponding to at least two pieces of input data that are greater than the second threshold; and the third calculation subunit is configured to perform non-uniform segmentation on input data between the first threshold and the second threshold, and calculating configuration parameters corresponding to input data in each segment.

In some embodiments, the third calculation subunit comprises a segmentation unit and an intra-segment configuration parameter calculation unit, the segmentation unit is configured to divide the input data between the first threshold and the second threshold into at least one non-uniform segment by using a successive approximation process; and the intra-segment configuration parameter calculation unit is configured to calculate configuration parameters corresponding to an input variable in each non-uniform segment, based on output values of the activation function corresponding to input data of at least two points in each non-uniform segment.

In some embodiments, the segmentation unit is further configured to: uniformly divide the input data between the first threshold and the second threshold into a set number of intervals, and uniformly divide each interval into a set number of sub-intervals; connect ½ sampled values of neighboring sub-intervals in each interval to obtain at least one straight line, and determine whether an error between each of the at least one straight line and an output value curve of the activation function at a corresponding position exceeds a preset error threshold; if not, combine every two neighboring straight lines in the obtained straight lines to obtain a combined straight line, and determine whether an error between the combined straight line and an output value curve of the activation function at a corresponding position exceeds the error threshold; and obtain at least one straight line in each interval through repetition, wherein a value range corresponding to each straight line is a segment of the input data.

In some embodiments, the storage address obtaining unit is further configured to: compare the result of the preprocessing of the to-be-processed input data with the first threshold and the second threshold; obtain a storage address of configuration parameters corresponding to the input data that is less than the first threshold, if the result of the preprocessing of the to-be-processed input data is less than the first threshold; obtain a storage address of configuration parameters corresponding to the input data that is greater than the second threshold, if the result of the preprocessing of the input data to be processed is greater than the second threshold; and search in a segment range of an interval into which the result of the preprocessing of the to-be-processed input data falls, and obtain a storage address of configuration parameters corresponding to the input data in the segment, if the result of the preprocessing of the input data to be processed falls between the first threshold and the second threshold.

According to a third aspect, the present application provides an artificial intelligence processor, including the data processing apparatus according to the second aspect, wherein the artificial intelligence processor further includes two or more groups of register stacks and static random access memories, wherein each group of register stack and static random access memory is configured to store configuration parameters of one sort of activation function, and configuration parameters of an activation function stored in each group of register stack and static random access memory are dynamically updated.

According to the data processing method and apparatus provided in the present application, received to-be-processed input data is preprocessed; a storage address of configuration parameters of the to-be-processed input data is obtained based on a result of the preprocessing and a result obtained by linearly fitting an activation function; the configuration parameters of the to-be-processed input data are acquired according to the storage address; and the result of the preprocessing of the to-be-processed input data is processed based on the configuration parameters of the to-be-processed input data and a preset circuit structure. Therefore, the processing of the input data to be processed can be realized by using the configuration parameters and the preset circuit structure, without the need of using a special circuit to implement the activation function, thereby simplifying the circuit structure, supporting various activation functions, and improving the flexibility.

BRIEF DESCRIPTION OF THE DRAWINGS

After reading detailed descriptions of non-limiting embodiments with reference to the following accompanying drawings, other features, objectives and advantages of the present application will be more apparent.

DETAILED DESCRIPTION OF EMBODIMENTS

The present application is further described in detail through the accompanying drawing and the embodiment. It should be understood that, the specific embodiments described herein are merely used to explain the relevant invention, and are not intended to limit the present invention. In addition, it should be further noted that, in order to facilitate the description, merely the parts related to the relevant invention are shown in the accompanying drawings.

It should be noted that, the embodiments of the present application and features in the embodiments may be combined on a non-conflict basis. The present application will be described in detail through the accompanying drawings and the embodiments.

Figure 1:
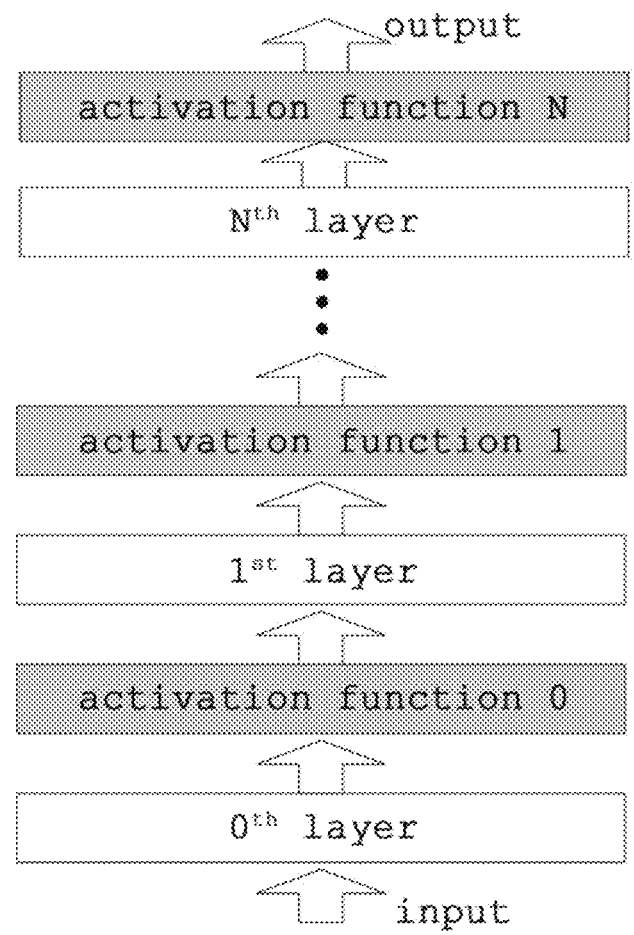
FIG. 1 is an exemplary diagram of a network structure of an deep learning algorithm in the prior art.
Figure 2:
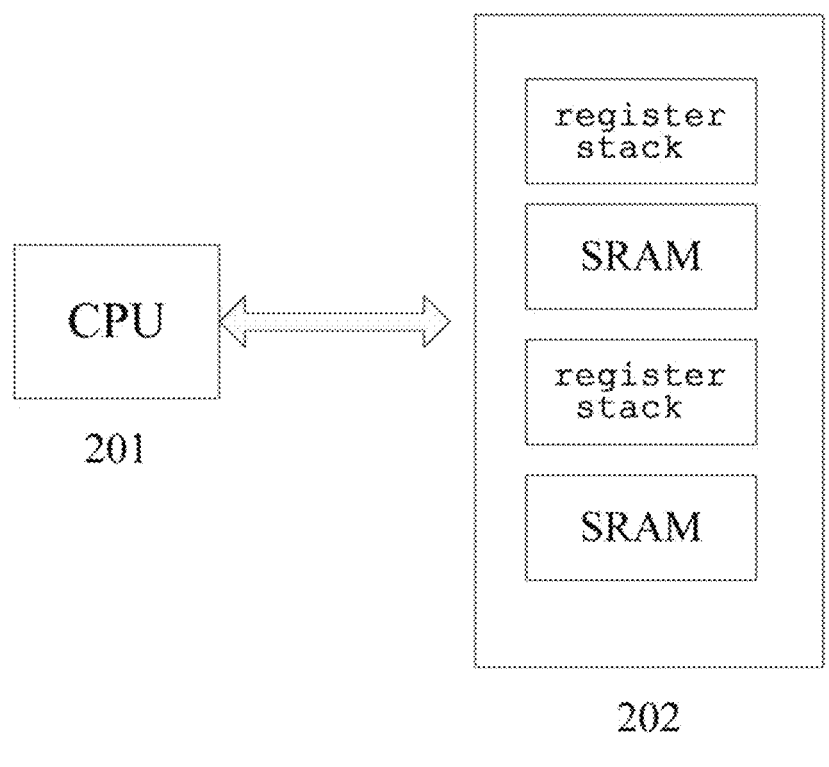
FIG. 2 is a diagram of an exemplary system architecture to which the present application can be applied.

FIG. 2 shows an exemplary system architecture 200 to which a data processing method or data processing apparatus of an embodiment of the present application can be applied.

As shown in FIG. 2, the system architecture 200 may include a CPU (Central Processing Unit) 201 and an artificial intelligence processor 202. The CPU 201 and the artificial intelligence processor 202 may be connected by using a bus such as a pcie bus.

The CPU 201 may be configured to perform piece-wise linear fitting for an activation function according to curve characteristics of the activation function, and generate configuration parameters according to a result of the fitting. The CPU 201 transmits the generated configuration parameters to the artificial intelligence processor 202 through the bus, and the artificial intelligence processor 202 may store the received configuration parameters into a register stack and/ or an SRAM (Static Random Access Memory). For example, the activation function curve may be piece-wise fitted by using a plurality of straight lines. The segment-related data (for example, the start coordinate of each interval, and the number of segments in each interval) obtained by performing piece-wise linear fitting for the activation function may be stored in the register stack, and the data (for example, the slope and intercept) related to the straight line corresponding to each segment obtained by piece-wise linear fitting may be stored in the SRAM. It would be appreciated that any number of register stacks and SRAMs may be disposed in the artificial intelligence processor 202, according to implementation requirements. For example, two or more groups of register stacks and SRAMs may be disposed. In use, each group of register stack and SRAM may store configuration parameters related to one sort of activation function, and data stored in each group of register stack and SRAM may be dynamically reconfigured according to processing requirements. The two or more groups of register stacks and SRAMs can improve the data processing parallelism of the artificial intelligence processor 202. For example, while the calculation is performed at a current layer, an activation function parameter table of a next layer may be configured concurrently. The concurrent configuration and layer calculation can save the time for configuration, so as to ensure that no extra time is needed for waiting for the parameter configuration, when the activation function is switched.

It should be noted that the data processing method provided in the embodiment of the present application is usually executed by the artificial intelligence processor 202. Correspondingly, the data processing apparatus is usually disposed in the artificial intelligence processor 202.

Figure 3:
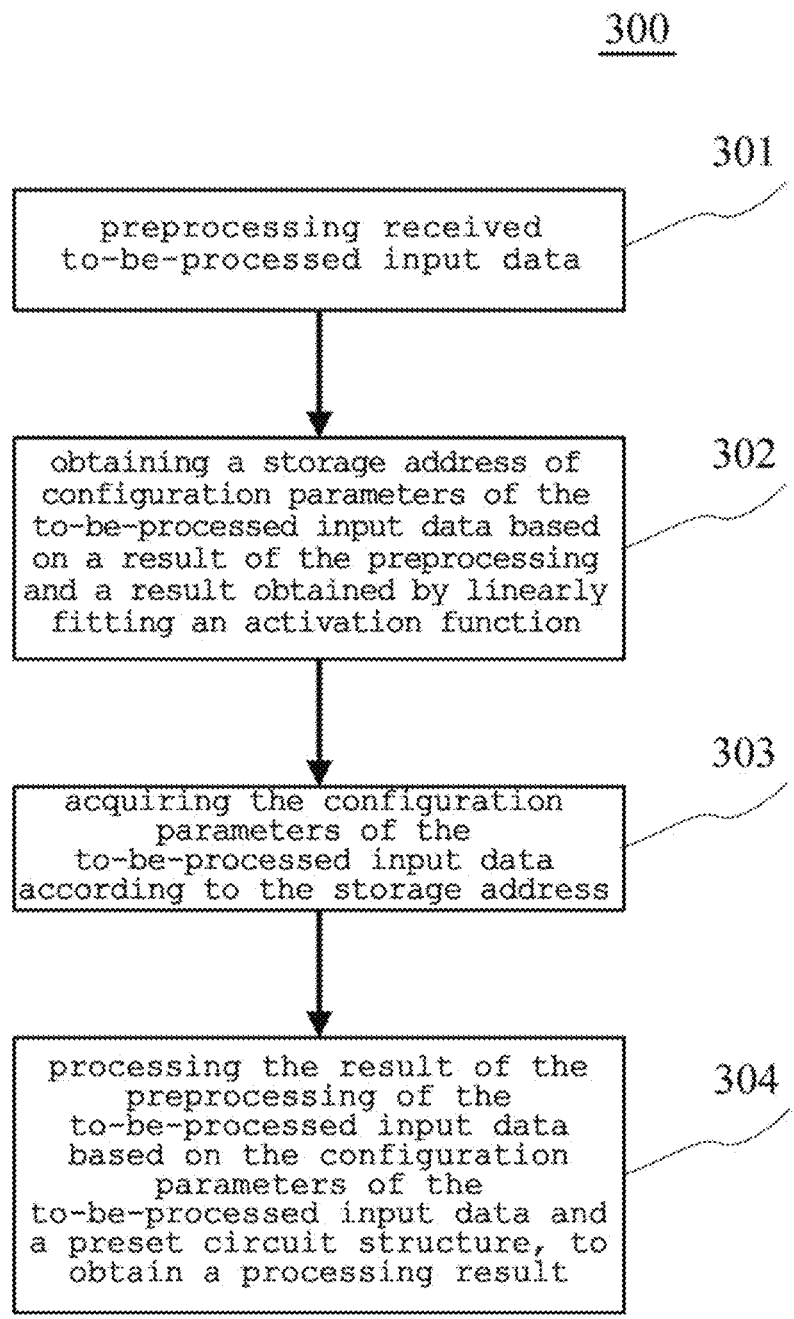
FIG. 3 is a flowchart of a data processing method according to an embodiment of the present application.

Referring to FIG. 3, it shows a flowchart 300 of a data processing method according to an embodiment of the present application. The data processing method includes the following steps.

Step 301: preprocessing received to-be-processed input data.

In this embodiment, an electronic device (for example, the artificial intelligence processor 202 shown in FIG. 2) on which the data processing method runs may perform various preprocessing on the input data to be processed which is received by an activation function between two layers of a deep learning algorithm. Here, the activation function may be any activation function.

In some alternative implementations of this embodiment, the input data to be processed may be a floating point number; and the electronic device may convert the input data to be processed into a fixed point number in various manners. For example, the input data to be processed may be converted into a fixed point number by using a preset floating-point to fixed-point circuit.

Step 302: obtaining a storage address of configuration parameters of the to-be-processed input data based on a result of the preprocessing and a result obtained by linearly fitting an activation function.

In this embodiment, the electronic device may obtain the storage address of the configuration parameters of the input data to be processed, based on the result of the preprocessing obtained in the step 301 and the result obtained by linearly fitting an activation function. The configuration parameters are set in advance according to curve characteristics of the activation function. For example, the electronic device may obtain a storage address of configuration parameters of an interval in which the input data to be processed is located according to an interval in which the straight lines obtained by linearly fitting the activation function are located.

Step 303: acquiring the configuration parameters of the to-be-processed input data according to the storage address.

In this embodiment, the electronic device may acquire the configuration parameters of the input data to be processed from the storage address obtained in the step 302.

Step 304: processing the result of the preprocessing of the to-be-processed input data based on the configuration parameters of the to-be-processed input data and a preset circuit structure, to obtain a processing result.

Figure 4:
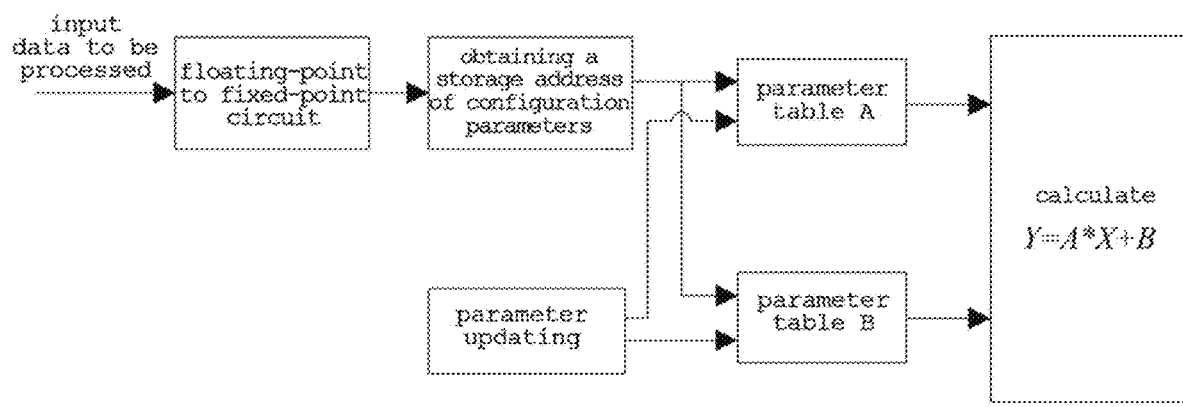
FIG. 4 exemplarily illustrates the processing of input data to be processed according to the present application.

In this embodiment, the electronic device may perform calculation or another processing on the result of the preprocessing of the input data to be processed, according to the configuration parameters acquired in the step 303 and the preset circuit structure. The preset circuit structure may be in various forms. For example, when the activation function is piece-wise fitted by using a plurality of straight lines, the circuit structure may be a circuit structure satisfying a straight line formula Y=A*X+B, wherein X represents an input, Y represents an output, A and B represents configuration parameters. For example, FIG. 4 exemplarily illustrates the processing of input data to be processed according to this embodiment. As shown in FIG. 4, firstly, the input data to be processed is converted into a fixed point number by using a preset floating-point to fixed-point circuit. Next, the storage address of the configuration parameters is obtained according to the obtained fixed point number. Then, the configuration parameters A and B are acquired from a parameter table A and a parameter table B that are respectively used to store the configuration parameters A and B according to the obtained storage address. Finally, Y=A*X+B is calculated according to the acquired configuration parameters A and B, to obtain a processing result. Parameters stored in the parameter table A and the parameter table B are not fixed, but may be dynamically updated according to the sort of the activation function needed during the processing.

In some alternative implementations of this embodiment, the data processing method may further include a step of presetting the configuration parameters based on the curve characteristics of the activation function. This step may be executed by the above electronic device, or may be executed by another electronic device (for example, the CPU 201 shown in FIG. 2). This step may include the followings.

Figure 5:
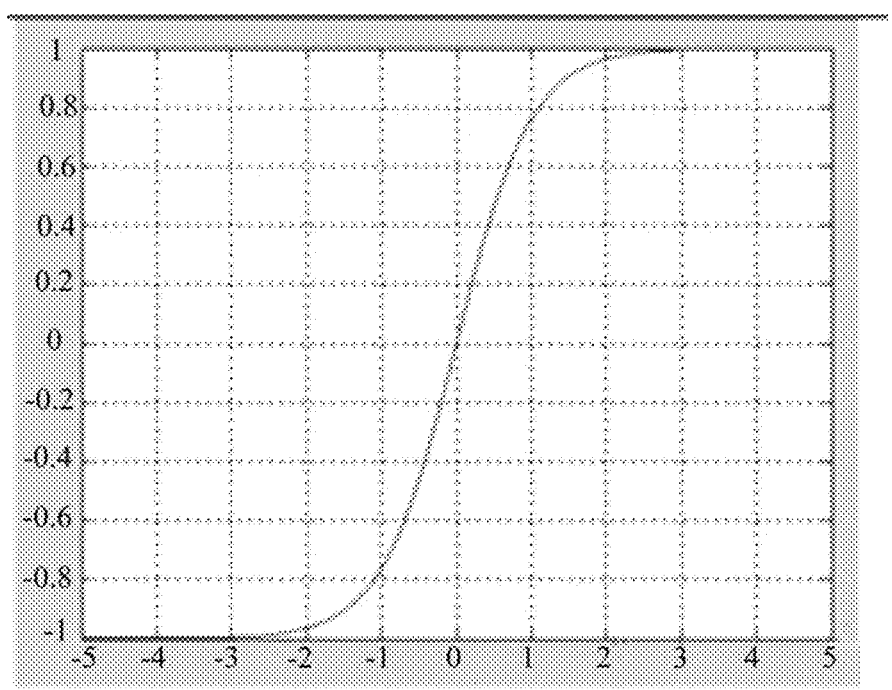
FIG. 5 is a curve graph of an activation function (1)

First, a first threshold and a second threshold for input data of the activation function are obtained based on a slope change of a curve of the activation function, wherein a slope change of the curve of the activation function corresponding to input data that is less than the first threshold or greater than the second threshold is less than a preset slope change threshold. The slope change threshold may be set according to practical requirements. Here, the activation function may be any activation function. Theoretically, the input data x of the activation function may have a value range of (−∞,+∞). However, it can be found according to the curve characteristics of the activation function that the activation function curve has a very small slope change, and is very close to a straight line, when the input data x is greater than a certain value or less than a certain value. Therefore, the activation function curve of each activation function can be fitted by using a straight line. For example, the curve shown in FIG. 5 is a curve of the following activation function (1). As can be seen from the curve graph, when x is less than −3, the curve is very close to the straight line f(x)=−1; and when x is greater than 3, the curve is very close to the straight line f(x)=1. Therefore, for the activation function (1), −3 may be used as the first threshold, and 3 may be used as the second threshold.

$$f(x) = \tanh(x) = \frac{2}{1+e^{-2x}} - 1 \quad (1)$$

Then, configuration parameters corresponding to input data that is less than the first threshold, input data that is greater than the second threshold, and input data that is between the first threshold and the second threshold are calculated respectively. Here, the configuration parameters may be obtained by linearly fitting the activation function. For example, if the activation function in an interval in which x is less than the first threshold is fitted to a straight line f(x)=$A_0$x+$B_0$, the configuration parameters may be $A_0$ and $B_0$; and if the activation function in an interval in which x is greater than the second threshold is fitted to a straight line f(x)=$A_1$x+$B_1$, the configuration parameters may be $A_1$ and $B_1$.

Finally, the input data and the configuration parameters are associated and stored. When the device executing this step is the above-mentioned electronic device, the input data and the configuration parameters may be associated and stored to a local storage unit. When the device executing this step is another electronic device, the other electronic device may transmit the input data and the configuration parameters, which are associated and stored, to the above-mentioned electronic device via a bus, and then the above-mentioned electronic device may store the input data and the configuration parameters.

In some alternative implementations, the calculating of the configuration parameters respectively corresponding to input data that is less than the first threshold, input data that is greater than the second threshold, and input data that is between the first threshold and the second threshold may be implemented by performing the following steps.

First, configuration parameters corresponding to the input data that is less than the first threshold are calculated based on output values of the activation function corresponding to at least two pieces of input data that are less than the first threshold. For example, when the first threshold is −3, and the activation function in the interval that is less than −3 may be fitted to a straight line $f(x)=A_0x+B_0$, values of the activation function at two points, x=−300 and x=−600, may be selected and used into the straight line formula $f(x)=A_0x+B_0$ to obtain the values $A_0$ and $B_0$.

Next, configuration parameters corresponding to the input data that is greater than the second threshold are calculated based on output values of the activation function corresponding to at least two pieces of input data that are greater than the second threshold. The specific process of this step may refer to the above step, and the details will not described herein.

Finally, non-uniform segmentation is performed on input data between the first threshold and the second threshold, and configuration parameters corresponding to input data in each segment are calculated. For example, the input data between the first threshold and the second threshold may be segmented according to the curve slope change. Then, the curve contained in each segment is fitted to a straight line. And, the configuration parameters of each segment are calculated according to the above step. By means of non-uniform segmentation, a part with a great curve slope change in the activation function curve can be divided into a large number of segments, and a part with a small curve slope change in the activation function curve can be divided into a small number of segments. In this way, high-precision curve fitting can be realized by using a small number of configuration parameters.

Alternatively, the performing non-uniform segmentation on input data between the first threshold and the second threshold, and calculating configuration parameters corresponding to input data in each segment may be realized by performing the following steps. First, the input data between the first threshold and the second threshold is divided into at least one non-uniform segment by using a successive approximation process; and then, configuration parameters corresponding to an input variable in each non-uniform segment are calculated based on output values of the activation function corresponding to input data of at least two points in each non-uniform segment.

Alternatively, the dividing the input data between the first threshold and the second threshold into at least one non-uniform segment by using a successive approximation process may be realized by performing the following steps. Firstly, the input data between the first threshold and the second threshold is uniformly divided into a set number of intervals, and each interval is uniformly divided into a set number of sub-intervals, wherein the number of intervals and the number of sub-intervals may be set according to computational accuracy requirements and the hardware storage capacity. Then, ½ sampled values of neighboring sub-intervals in each interval are connected to obtain at least one straight line, and it determines whether an error between each of the at least one straight line and an output value curve of the activation function at a corresponding position exceeds a preset error threshold. If not, every two neighboring straight lines in the obtained straight lines are combined to obtain a combined straight line, and it determines whether an error between the combined straight line and an output value curve of the activation function at a corresponding position exceeds the error threshold. At least one straight line in each interval can be obtained by analogy, wherein a value range corresponding to each straight line is a segment of the input data.

Figure 6:
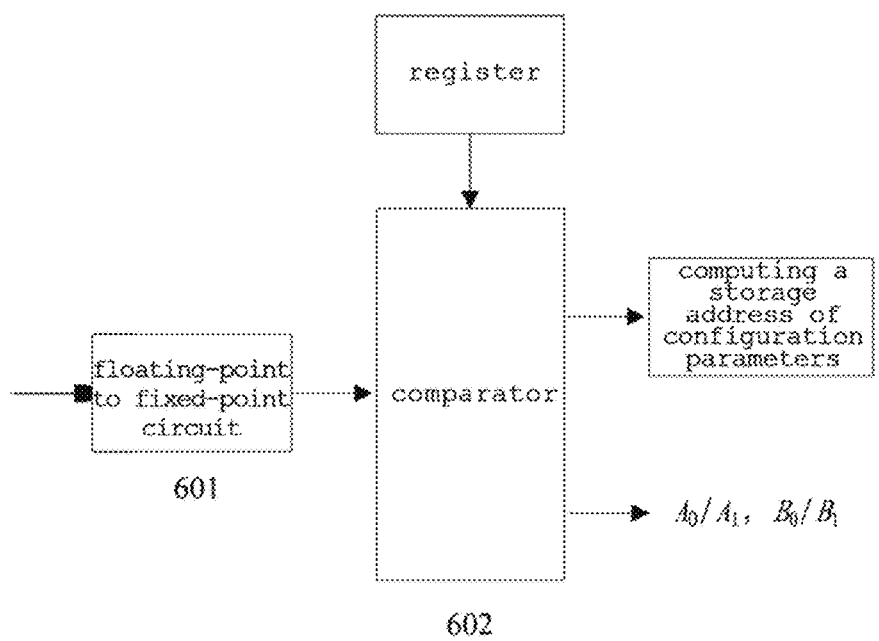
FIG. 6 exemplarily illustrates the acquisition of a storage address of configuration parameters by using a comparator.

Alternatively, the obtaining a storage address of configuration parameters of the to-be-processed input data based on a result of the preprocessing and a result obtained by linearly fitting an activation function in the step 302 may be realized by: comparing the result of the preprocessing of the to-be-processed input data with the first threshold and the second threshold; obtaining a storage address of configuration parameters corresponding to the input data that is less than the first threshold, if the result of the preprocessing of the to-be-processed input data is less than the first threshold; obtaining a storage address of configuration parameters corresponding to the input data that is greater than the second threshold, if the result of the preprocessing of the input data to be processed is greater than the second threshold; and searching in a segment range of an interval into which the result of the preprocessing of the to-be-processed input data falls, and obtaining a storage address of configuration parameters corresponding to the input data in the segment, if the result of the preprocessing of the input data to be processed falls between the first threshold and the second threshold. For example, when the input data x of the activation function is between the first threshold and the second threshold, the storage address address of the configuration parameters may be obtained by using the following calculation: address=$n*(x-i_{base})/(i_{max}-i_{base})+m$, wherein m represents the total number of segments in all intervals before an interval i and may be calculated by accumulation, m should be controlled within an appropriate range (for example, less than 4096) with the limitations of the storage space of an on-chip SRAM; $i_{base}$ and $i_{max}$ respectively represent a minimum value and a maximum value of x coordinates in the $i^{th}$ interval in a set number of intervals obtained by uniform division between the first threshold and the second threshold, $i^{base}$ and $i_{max}$ may be obtained by comparing x with interval information in a register stack one by one; n represents the number of segments obtained by dividing the $i^{th}$ interval (this information is stored in the register stack), m may be used to represent a base address of the $i^{th}$ interval in the on-chip SRAM, and $n*(x-i_{base})/(i_{max}-i_{base})$ may be used to calculate an offset address of x in the $i^{th}$ interval. Here, the above comparison process may be implemented by means of software or hardware (for example, by using a comparator). For example, FIG. 6 shows an implementation of obtaining the storage address of configuration parameters by using a comparator. As shown in FIG. 6, segment-related data (for example, the start coordinates of each segment) and configuration parameters can be obtained by linearly fitting the activation function. The segment-related data may be stored in a register. After the input data x is converted into a fixed point number by using a floating-point to fixed-point circuit 601, a comparator 602 compares the input data x with data stored in the register to obtain the segment in which the input data x locates. If the result is less than the first threshold, corresponding configuration parameters $A_0$ and $B_0$ can be obtained directly. If the result is greater than the second threshold, corresponding configuration parameters $A_1$ and $B_1$ can be obtained directly. If the result is between the first threshold and the second threshold, the storage address of the configuration parameters can be calculated according to the above formula address=$n*(x-i_{base})/(i_{max}-i_{base})+m$ that is used for calculating the storage address address. According to the method provided in the above embodiment of the present application, an activation function is piece-wise fitted according to curve characteristics of the activation function to obtain configuration parameters of each segment, configuration parameters of the input data to be processed are acquired according to the segment in which the input data to be processed locates, and a processing result of the input data to be processed is obtained according to the acquired configuration parameters and a preset circuit structure. The entire processing process does not require the use of a special circuit for implementing the activation function, thereby simplifying the circuit structure. In addition, the method provided in the above embodiment is applicable to various activation functions, thereby improving the flexibility of data processing.

Figure 7:
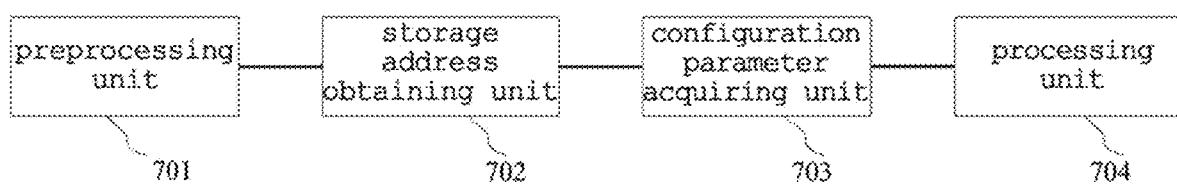
FIG. 7 is a schematic structural diagram of a data processing apparatus according to an embodiment of the present application.

Further referring to FIG. 7, which is an implementation of the methods shown in the above-mentioned figures, the present application provides an embodiment of a data processing device. The device embodiment corresponds to the method embodiment shown in FIG. 3, and may be applied to various electronic devices.

As shown in FIG. 7, the data processing apparatus 700 described in this embodiment includes: a preprocessing unit 701, a storage address obtaining unit 702, a configuration parameter acquiring unit 703, and a processing unit 704. The preprocessing unit 701 is configured to preprocess received to-be-processed input data. The storage address obtaining unit 702 is configured to obtain a storage address of configuration parameters of the to-be-processed input data based on a result of the preprocessing and a result obtained by linearly fitting an activation function, the configuration parameters being preset according to curve characteristics of the activation function. The configuration parameter acquiring unit 703 is configured to acquire the configuration parameters of the to-be-processed input data according to the storage address. The processing unit 704 is configured to process the result of the preprocessing of the to-be-processed input data based on the configuration parameters of the to-be-processed input data and a preset circuit structure, to obtain a processing result.

In this embodiment, the detailed processing of the preprocessing unit 701, the storage address obtaining unit 702, the configuration parameter acquiring unit 703, and the processing unit 704 may refer to the detailed description of step 301, step 302, step 303, and step 304 in the embodiment corresponding to FIG. 3, and will not be described herein.

In some alternative implementations of this embodiment, the to-be-processed input data is a floating point number; and the preprocessing unit 701 is further configured to: convert the to-be-processed input data into a fixed point number. The detailed implementation may refer to that corresponding to the embodiment of FIG. 3, and will not be described herein.

In some alternative implementations of this embodiment, the apparatus further includes a parameter configuring unit (not shown), wherein the parameter configuring unit comprises a threshold obtaining unit (not shown), a calculation unit (not shown), and a storage unit (not shown). The threshold obtaining unit is configured to obtain a first threshold and a second threshold for input data of the activation function based on a slope change of a curve of the activation function, wherein a slope change of the curve of the activation function corresponding to input data that is less than the first threshold or greater than the second threshold is less than a preset slope change threshold; the calculation unit is configured to calculate configuration parameters respectively corresponding to input data that is less than the first threshold, input data that is greater than the second threshold, and input data that is between the first threshold and the second threshold; and the storage unit is configured to associate and store the input data and the configuration parameters. The detailed implementation may refer to that corresponding to the embodiment of FIG. 3, and will not be described herein.

In some alternative implementations of this embodiment, the calculation unit includes a first calculation subunit (not shown), a second calculation subunit (not shown), and a third calculation subunit (not shown). The first calculation subunit is configured to calculate configuration parameters corresponding to the input data that is less than the first threshold, based on output values of the activation function corresponding to at least two pieces of input data that are less than the first threshold; the second calculation subunit is configured to calculate configuration parameters corresponding to the input data that is greater than the second threshold, based on output values of the activation function corresponding to at least two pieces of input data that are greater than the second threshold; and the third calculation subunit is configured to perform non-uniform segmentation on input data between the first threshold and the second threshold, and calculating configuration parameters corresponding to input data in each segment. The detailed implementation may refer to that corresponding to the embodiment of FIG. 3, and will not be described herein.

In some alternative implementations of this embodiment, the third calculation subunit comprises a segmentation unit (not shown) and an intra-segment configuration parameter calculation unit (not shown). The segmentation unit is configured to divide the input data between the first threshold and the second threshold into at least one non-uniform segment by using a successive approximation process; and the intra-segment configuration parameter calculation unit is configured to calculate configuration parameters corresponding to an input variable in each non-uniform segment, based on output values of the activation function corresponding to input data of at least two points in each non-uniform segment. The detailed implementation may refer to that corresponding to the embodiment of FIG. 3, and will not be described herein.

In some alternative implementations of this embodiment, the segmentation unit is further configured to: uniformly divide the input data between the first threshold and the second threshold into a set number of intervals, and uniformly divide each interval into a set number of subintervals; connect ½ sampled values of neighboring subintervals in each interval to obtain at least one straight line, and determine whether an error between each of the at least one straight line and an output value curve of the activation function at a corresponding position exceeds a preset error threshold; if not, combine every two neighboring straight lines in the obtained straight lines to obtain a combined straight line, and determine whether an error between the combined straight line and an output value curve of the activation function at a corresponding position exceeds the error threshold; and obtain at least one straight line in each interval through repetition, wherein a value range corresponding to each straight line is a segment of the input data. The detailed implementation may refer to that corresponding to the embodiment of FIG. 3, and will not be described herein.

In some alternative implementations of this embodiment, the storage address obtaining unit 702 is further configured to: compare the result of the preprocessing of the to-be-processed input data with the first threshold and the second threshold; obtain a storage address of configuration parameters corresponding to the input data that is less than the first threshold, if the result of the preprocessing of the to-be-processed input data is less than the first threshold; obtain a storage address of configuration parameters corresponding to the input data that is greater than the second threshold, if the result of the preprocessing of the input data to be processed is greater than the second threshold; and search in a segment range of an interval into which the result of the preprocessing of the to-be-processed input data falls, and obtain a storage address of configuration parameters corresponding to the input data in the segment, if the result of the preprocessing of the input data to be processed falls between the first threshold and the second threshold. The detailed implementation may refer to that corresponding to the embodiment of FIG. 3, and will not be described herein.

The embodiments of the present application also provides an artificial intelligence processor. The artificial intelligence processor may include the data processing apparatus that is described in the embodiment corresponding to FIG. 7. The artificial intelligence processor may further include two or more groups of register stacks and static random access memories, wherein each group of register stack and static random access memory is configured to store configuration parameters of one sort of activation function, and configuration parameters of an activation function stored in each group of register stack and static random access memory are dynamically updated.

The foregoing is only a description of the preferred embodiments of the present application and the applied technical principles. It should be appreciated by those skilled in the art that the inventive scope of the present application is not limited to the technical solutions formed by the particular combinations of the above technical features. The inventive scope should also cover other technical solutions formed by any combinations of the above technical features or equivalent features thereof without departing from the concept of the invention, such as, technical solutions formed by replacing the features as disclosed in the present application with (but not limited to), technical features with similar functions.

What is claimed is:

1. A data processing method, comprising:
receiving configuration parameters which are generated based on a linear fitting of an activation function according to curve characteristics of the activation function and storing segment-related data of the configuration parameters into a register stack and storing slope-intercept related data for each segment into a random access memory (SRAM);
preprocessing received to-be-processed input data;
obtaining a storage address of the configuration parameters of the to-be-processed input data based on a result of the preprocessing and a result obtained by linearly fitting the activation function, the configuration parameters being preset according to the curve characteristics of the activation function;
acquiring the configuration parameters of the to-be-processed input data according to the storage address; and
processing the result of the preprocessing of the to-be-processed input data based on the configuration parameters of the to-be-processed input data and a preset circuit structure, to obtain a processing result;
wherein the presetting the configuration parameters according to the curve characteristics of the activation function comprises:
obtaining a first threshold and a second threshold for input data of the activation function based on a slope change of a curve of the activation function, wherein a slope change of the curve of the activation function corresponding to input data that is less than the first threshold or greater than the second threshold is less than a preset slope change threshold;
calculating configuration parameters respectively corresponding to input data that is less than the first threshold, input data that is greater than the second threshold, and input data that is between the first threshold and the second threshold; and
associating and storing the input data and the configuration parameters;
wherein the obtaining of the storage address of the configuration parameters of the to-be-processed input data based on the result of the preprocessing and the result obtained by linearly fitting the activation function comprises:
comparing the result of the preprocessing of the to-be-processed input data with the first threshold and the second threshold;
if the result of the preprocessing of the to-be-processed input data is less than the first threshold, obtaining the storage address in the SRAM of configuration parameters corresponding to the input data that is less than the first threshold;
if the result of the preprocessing of the input data to be processed is greater than the second threshold, obtaining the storage address in the SRAM of configuration parameters corresponding to the input data that is greater than the second threshold; and
if the result of the preprocessing of the input data to be processed falls between the first threshold and the second threshold, searching in the register stack in a segment range of an interval into which the result of the preprocessing of the to-be-processed input data falls, and obtaining the storage address in the SRAM of configuration parameters corresponding to the input data in the segment.

2. The method according to claim 1, wherein the to-be-processed input data is a floating point number; and
the preprocessing received to-be-processed input data comprises:
converting the to-be-processed input data into a fixed point number.

3. The method according to claim 1, wherein the calculating configuration parameters respectively corresponding to input data that is less than the first threshold, input data that is greater than the second threshold, and input data that is between the first threshold and the second threshold comprises:
calculating configuration parameters corresponding to the input data that is less than the first threshold, based on output values of the activation function corresponding to at least two pieces of input data that are less than the first threshold;
calculating configuration parameters corresponding to the input data that is greater than the second threshold, based on output values of the activation function corresponding to at least two pieces of input data that are greater than the second threshold; and
performing non-uniform segmentation on input data between the first threshold and the second threshold, and calculating configuration parameters corresponding to input data in each segment.

4. The method according to claim 3, wherein the performing non-uniform segmentation on input data between the first threshold and the second threshold, and calculating configuration parameters corresponding to input data in each segment comprises:
dividing the input data between the first threshold and the second threshold into at least one non-uniform segment by using a successive approximation process; and calculating configuration parameters corresponding to an input variable in each non-uniform segment, based on output values of the activation function corresponding to input data of at least two points in each non-uniform segment.

5. The method according to claim 4, wherein the dividing the input data between the first threshold and the second threshold into at least one non-uniform segment by using a successive approximation process comprises:
uniformly dividing the input data between the first threshold and the second threshold into a set number of intervals, and uniformly dividing each interval into a set number of sub-intervals;
connecting ½ sampled values of neighboring sub-intervals in each interval to obtain at least one straight line, and determining whether an error between each of the at least one straight line and an output value curve of the activation function at a corresponding position exceeds a preset error threshold;
if the error between each of the at least one straight line and the output value curve of the activation function at the corresponding position does not exceed the preset error threshold, combining every two neighboring straight lines in the obtained straight lines to obtain a combined straight line, and determining whether an error between the combined straight line and an output value curve of the activation function at a corresponding position exceeds the error threshold; and
obtaining at least one straight line in each interval through repetition, wherein a value range corresponding to each straight line is a segment of the input data.

6. A data processing apparatus, comprising:
at least one processor; and
a memory storing instructions, the instructions when executed by the at least one processor, cause the at least one processor to perform operations, the operations comprising:
receiving configuration parameters which are generated based on a linear fitting of an activation function according to curve characteristics of the activation function and storing segment-related data of the configuration parameters into a register stack and storing slope-intercept related data for each segment into a static random access memory (SRAM);
preprocessing received to-be-processed input data;
obtaining a storage address of the configuration parameters of the to-be-processed input data based on a result of the preprocessing and a result obtained by linearly fitting the activation function, the configuration parameters being preset according to curve characteristics of the activation function;
acquiring the configuration parameters of the to-be-processed input data according to the storage address; and
processing the result of the preprocessing of the to-be-processed input data based on the configuration parameters of the to-be-processed input data and a preset circuit structure, to obtain a processing result;
wherein the presetting the configuration parameters according to the curve characteristics of the activation function comprises:
obtaining a first threshold and a second threshold for input data of the activation function based on a slope change of a curve of the activation function, wherein a slope change of the curve of the activation function corresponding to input data that is less than the first threshold or greater than the second threshold is less than a preset slope change threshold;
calculating configuration parameters respectively corresponding to input data that is less than the first threshold, input data that is greater than the second threshold, and input data that is between the first threshold and the second threshold; and
associating and storing the input data and the configuration parameters;
wherein the obtaining the storage address of the configuration parameters of the to-be-processed input data based on the result of the preprocessing and the result obtained by linearly fitting the activation function comprises:
comparing the result of the preprocessing of the to-be-processed input data with the first threshold and the second threshold;
if the result of the preprocessing of the to-be-processed input data is less than the first threshold, obtaining the storage address in the SRAM of configuration parameters corresponding to the input data that is less than the first threshold;
if the result of the preprocessing of the input data to be processed is greater than the second threshold, obtaining the storage address in the SRAM of configuration parameters corresponding to the input data that is greater than the second threshold; and
if the result of the preprocessing of the input data to be processed falls between the first threshold and the second threshold, searching in the register stack in a segment range of an interval into which the result of the preprocessing of the to-be-processed input data falls, and obtaining the storage address in the SRAM of configuration parameters corresponding to the input data in the segment.

7. The apparatus according to claim 6, wherein the to-be-processed input data is a floating point number; and the preprocessing received to-be-processed input data comprises:
converting the to-be-processed input data into a fixed point number.

8. The apparatus according to claim 6, wherein the calculating configuration parameters respectively corresponding to input data that is less than the first threshold, input data that is greater than the second threshold, and input data that is between the first threshold and the second threshold comprises:
calculating configuration parameters corresponding to the input data that is less than the first threshold, based on output values of the activation function corresponding to at least two pieces of input data that are less than the first threshold;
calculating configuration parameters corresponding to the input data that is greater than the second threshold, based on output values of the activation function corresponding to at least two pieces of input data that are greater than the second threshold; and
performing non-uniform segmentation on input data between the first threshold and the second threshold, and calculating configuration parameters corresponding to input data in each segment.

9. The apparatus according to claim 8, wherein the performing non-uniform segmentation on input data between the first threshold and the second threshold, and calculating configuration parameters corresponding to input data in each segment comprises:
dividing the input data between the first threshold and the second threshold into at least one non-uniform segment by using a successive approximation process; and calculating configuration parameters corresponding to an input variable in each non-uniform segment, based on output values of the activation function corresponding to input data of at least two points in each non-uniform segment.

10. The apparatus according to claim 9, wherein the dividing the input data between the first threshold and the second threshold into at least one non-uniform segment by using a successive approximation process comprises:

uniformly dividing the input data between the first threshold and the second threshold into a set number of intervals, and uniformly divide each interval into a set number of sub-intervals;

connecting ½ sampled values of neighboring sub-intervals in each interval to obtain at least one straight line, and determining whether an error between each of the at least one straight line and an output value curve of the activation function at a corresponding position exceeds a preset error threshold;

if the error between each of the at least one straight line and the output value curve of the activation function at the corresponding position does not exceed the preset error threshold, combining every two neighboring straight lines in the obtained straight lines to obtain a combined straight line, and determining whether an error between the combined straight line and an output value curve of the activation function at a corresponding position exceeds the error threshold; and obtaining at least one straight line in each interval through repetition, wherein a value range corresponding to each straight line is a segment of the input data.

11. The data processing apparatus according to claim 6, wherein the processor comprises two or more groups of register stacks and two or more groups of SRAM, wherein each group of register stacks and SRAM is configured to store configuration parameters of a unique activation function, and configuration parameters of an activation function stored in each group of register stacks and SRAM are dynamically updated.

12. The data processing apparatus according to claim 11, wherein the processor is configured to concurrently obtain the processing result of a current layer of a deep learning algorithm based on configuration parameters stored in a first group of register stacks and SRAM and preset the configuration parameters stored in a second group of register stacks and SRAM of a next layer prior to switching activation functions.

* * * * *